United States Patent
Lammert et al.

(10) Patent No.: US 7,342,951 B2
(45) Date of Patent: Mar. 11, 2008

(54) LASER DIODE WITH A FREQUENCY CONVERTER

(75) Inventors: Robert M. Lammert, Sierra Madre, CA (US); Jeffrey E. Ungar, Valley Village, CA (US)

(73) Assignee: Quintessence Photonics Corporation, Sylmar, CA (US)

( * ) Notice: Subject to any disclaimer, the term of this patent is extended or adjusted under 35 U.S.C. 154(b) by 273 days.

(21) Appl. No.: 11/039,342

(22) Filed: Jan. 18, 2005

(65) Prior Publication Data
US 2006/0056477 A1 Mar. 16, 2006

Related U.S. Application Data

(60) Provisional application No. 60/537,444, filed on Jan. 16, 2004.

(51) Int. Cl.
*H01S 3/20* (2006.01)

(52) U.S. Cl. ............... 372/53; 372/29.023; 372/64; 372/50.1

(58) Field of Classification Search ............... 372/50.1, 372/29.023, 64, 53
See application file for complete search history.

(56) References Cited

U.S. PATENT DOCUMENTS

| | | | | |
|---|---|---|---|---|
| 5,436,757 A | * | 7/1995 | Okazaki et al. | ............. 359/332 |
| RE35,215 E | * | 4/1996 | Waarts et al. | ............... 372/108 |
| 2006/0193231 A1 | * | 8/2006 | Mizuuchi et al. | ............. 369/94 |

* cited by examiner

*Primary Examiner*—Dung T. Nguyen
(74) *Attorney, Agent, or Firm*—Ben J. Yorks; Irell & Manella LLP

(57) ABSTRACT

A semiconductor laser diode that internally converts one or more short wavelength "pump" beams to an output beam at a longer wavelength using nonlinear optical frequency conversion in the semiconductor. Modal phase matching of the pump and output beams in a semiconductor waveguide allows the conversion process to proceed with high efficiency.

15 Claims, 1 Drawing Sheet

LASER DIODE WITH A FREQUENCY CONVERTER

CROSS REFERENCE TO RELATED APPLICATIONS

This application claims priority to provisional Application No. 60/537,444, filed on Jan. 16, 2004.

BACKGROUND OF THE INVENTION

1. Field of the Invention

The subject matter disclosed generally relates to the field of semiconductor lasers.

2. Background Information

There are many applications for laser sources that generate laser beams in the mid-infrared range of wavelengths between 2 and 10 microns, including infrared countermeasures, environmental pollutant monitoring, spectroscopic analysis, chemical weapons defense and free-space optical communications.

The most compact, efficient, rugged and inexpensive laser sources are PN junction laser diodes, but available semiconductor materials limit them to short wavelengths in the 3 micron range and below.

Solid-state and gas lasers (for example, Holmium doped YAG, or Carbon Dioxide, respectively) exist for a few specific spectral lines in this region, but for most of the region there are no convenient and effective laser sources. Available sources such as optical parametric oscillators have serious shortcomings such as high cost, low efficiency, poor reliability and limited wavelength range.

Quantum cascade lasers are semiconductor devices that generate light over much of this spectral region, but their electrical-to-optical efficiencies are limited to only a few percent. They require significant cooling (often to cryogenic temperatures) to remove waste heat, and are not easily used outside of laboratory environments.

A PN junction source of laser radiation in this wavelength range could provide advantages such as ruggedness, low cost and high efficiency compared to existing sources and would be highly desirable.

BRIEF SUMMARY OF THE INVENTION

A semiconductor laser diode that internally converts one or more short wavelength "pump" beams to an output beam at a longer wavelength using nonlinear optical frequency conversion in the semiconductor. Modal phase matching of the pump and output beams in a semiconductor waveguide allows the conversion process to proceed with high efficiency.

DETAILED DESCRIPTION

Disclosed is a monolithic semiconductor laser diode that generates a laser beam at a "pump" wavelength, and which incorporates an internal semiconductor optical waveguide in which energy from the pump beam is converted by optical nonlinearities to laser light at an output beam at a different, longer wavelength.

Semiconducting materials such as Gallium Aluminum Arsenide or Indium Gallium Arsenide Phosphide, used in the construction of laser diodes have strong optical nonlinearities which could in principle be used to convert light from one frequency ("pump" beam) to another frequency ("output" beam). This is not ordinarily an efficient process, however, because material refractive index dispersion causes the pump and generated beams to fall out of phase with each other over short distances (typically micron length scales).

The present invention avoids the "phase-mismatch" problem by performing the nonlinear conversion within an optical waveguide designed so that waveguide modal dispersion compensates for the material dispersion. For example, if a short wavelength pump beam oscillates in the $TE_{02}$ mode, while the longer wavelength generated beams oscillate in $TE_{00}$ modes, the material dispersion, which would have caused the short wave pump beam to have lower phase velocity than the generated beams, can be compensated by modal dispersion, which increases the phase velocity of $TE_{02}$ pump mode relative to the $TE_{00}$ modes. The frequency conversion process can therefore proceed over arbitrarily long distance (typically millimeters) and can be very efficient.

Figure 1:
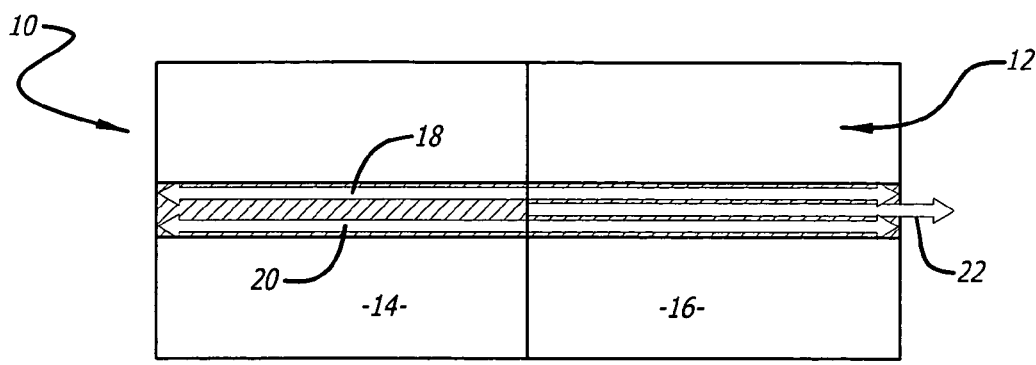
FIG. 1 is an illustration showing the different sections of a semiconductor laser that generates light in the mid-infrared range.

FIG. 1 is a schematic illustration showing a semiconductor laser 10 constructed as a single monolithic semiconductive die 12. The die 12 includes a laser section 14 and a waveguide frequency conversion section 16. The laser section 14 generates a first light beam 18 and a second light beam 20. The first 18 and second 20 light beams travel along the waveguide section 16. The nonlinear properties of the semiconductive material in the waveguide section 16 mixes the laser beams 18 and 20 to produce a third laser beam 22. By way of example, the first 18 and second 20 laser beams may both be in the near infrared range and mix to produce a third beam 22 in the mid-infrared range. The waveguide section 16 functions as a intra-cavity difference frequency generator.

Figure 2:
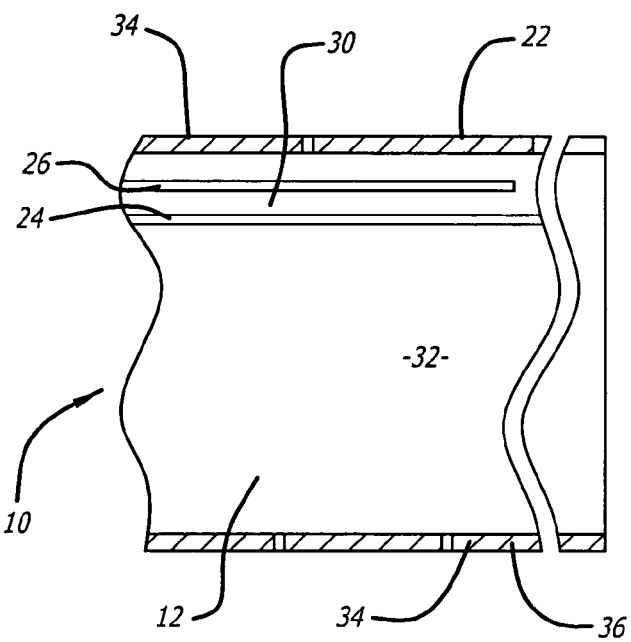
FIG. 2 is an illustration showing a side sectional view of a semiconductor laser.

As shown in FIG. 2, the laser section 14 may include a gain layer 24 and a diffraction grating feedback layer 26. The gain layer 24 is located between a P-type layer 30 and a N-type substrate 32 to provide the optical gain required for oscillation. Electrical contacts 34 may be located at the top surface 22 and a bottom surface 36 of the die 12. The contacts 34 are connected to a source of electrical power that induces a migration of holes and electrons from the layers 32 and 30 to the active layer 24. The holes and electrons recombine and emit photons.

The laser section 14 may have a single PN junction active layer that generates the first laser beam 18, in which case both the second laser beam 20 ("idler beam") and the third laser beam 22 ("output beam") are be internally generated by the Optical Parametric Oscillation process. Alternatively, the laser section 14 may have two active layers tuned to different wavelengths to directly generate laser beams 18 and 20.

The diffraction grating feedback layer 26, which may be composed of a semiconductor alloy differing in refractive index from the P-type layer 30, is corrugated with a period satisfying the Bragg condition for the desired frequency of oscillation in order to enhance conversion efficiency. Layer 26 may extend along the entire length of the laser, in which case it forms a distributed feedback laser, or it may extend over part of the length, in which case it forms a distributed Bragg reflector laser. Additional diffraction Bragg layers (not shown) may be provided to enhance feedback at the idler and pump frequencies.

The semiconductive die 12 can be epitaxially grown on an indium-phosphide, gallium-arsenide or other III-V semiconducting substrate. The laser section 14 and waveguide section 16 are formed in a monolithic die that is rugged and can be mass produced with known fabrication techniques. In fact, although for ease of exposition laser section 14 and waveguide section 16 are shown as separate sections, they can in fact be combined as a single section. Utilizing known fabrication techniques minimizes the cost of the producing the laser.

Figure 3:
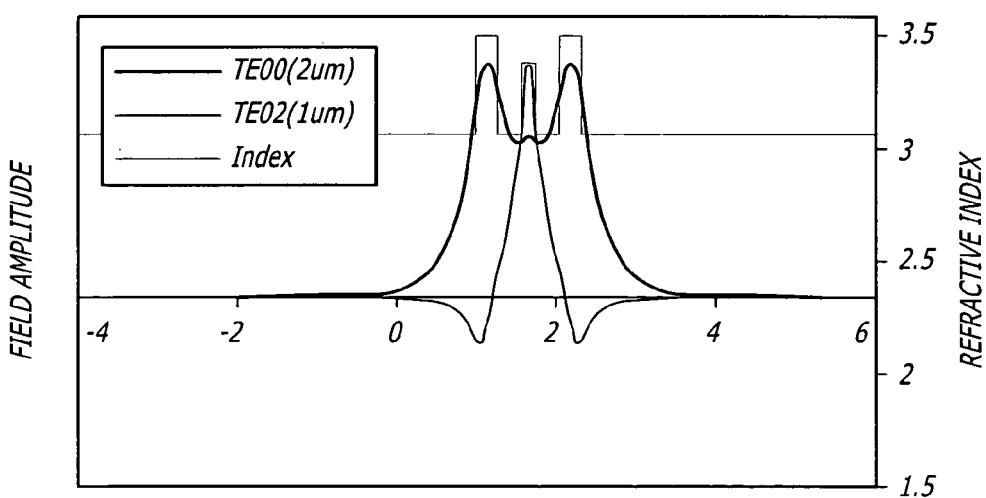
FIG. 3 is a graph showing the light intensities of a pump beam and a product beam within a waveguide that has seven layers.

FIG. 3 shows an example of a multi-layer AlGaAs/GaAs multilayer waveguide designed to phase match a $TE_{02}$ pump beam oscillating at 1 µm to degenerate idler and output beams oscillating in the $TE_{00}$ mode at 2 microns. The seven layer waveguide design shown has high spatial overlap between the electrical fields of the pump and output beams in order to increase efficiency, but many other waveguide designs of equal or higher efficiency are possible.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. In particular, an essentially equivalent laser could be made if the conductivity types of P-doped and N-doped layers are reversed, if the positions of active layer 28 and distributed feedback layers 26 are reversed.

What is claimed is:

1. A semiconductor laser, comprising:
    a semiconductive die that includes;
        a laser section that generates a first laser beam and a second laser beam; and,
        a waveguide section that is optically coupled to said laser section to receive, mix and phase match said first and second laser beams to produce a third laser beam having a wavelength in a mid infrared range.

2. The laser of claim 1, wherein said semiconductive die is fabricated from group III-V semiconductive material.

3. The laser of claim 1, wherein said laser section includes a first gain area that generates said first laser beam and a second gain area that generates said second laser beam.

4. The laser of claim 1, wherein said laser section includes a first gain area that generates said first laser beam and said second laser beam is created through optical parametric oscillation.

5. The laser of claim 1, wherein said waveguide section includes a plurality of layers that phase match said laser beams.

6. The laser of claim 5, wherein said waveguide section includes seven layers.

7. A semiconductor laser, comprising:
    a semiconductive die that includes;
        laser means for generating a first laser beam and a second laser beam; and,
        difference frequency generator means for receiving, mixing and phase matching said first and second laser beams and producing a third laser beam having a wavelength in a mid infrared range.

8. The laser of claim 7, wherein said semiconductive die is fabricated from group III-V semiconductive material.

9. The laser of claim 7, wherein said laser means includes a first gain area that generates said first laser beam and a second gain area that generates said second laser beam.

10. The laser of claim 7, wherein said laser means includes a first gain area that generates said first laser beam and said second laser beam is created through optical parametric oscillation.

11. The laser of claim 7, wherein said difference frequency generator means includes a plurality of layers that phase match said laser beams.

12. The laser of claim 11, wherein said difference frequency generator means includes seven layers.

13. A method for operating a semiconductor laser, comprising:
    generating a first laser beam and a second laser beam within a semiconductive die; and,
    producing a third laser beam in a mid-infrared range from the first and second laser beams within a waveguide of the semiconductive die that receives, mixes and phase matches the first and second laser beams.

14. The method of claim 13, wherein the first laser beam is generated by a first gain area of the semiconductive die and the second laser beam is generated by a second gain area of the semiconductive die.

15. The method of claim 13, wherein the first laser beam is generated by a first gain area of the semiconductive die and the second laser beam is generated by optical parametric oscillation.

* * * * *